(12) United States Patent
Schmid

(10) Patent No.: US 11,265,090 B2
(45) Date of Patent: Mar. 1, 2022

(54) METHOD AND SYSTEM FOR DETERMINING AND/OR ADJUSTING PHASES OF AT LEAST TWO ELECTRICAL SIGNALS

(71) Applicant: Rohde & Schwarz GmbH & Co. KG, Munich (DE)

(72) Inventor: Simon Schmid, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/038,808

(22) Filed: Sep. 30, 2020

(65) Prior Publication Data

US 2021/0143918 A1 May 13, 2021

(30) Foreign Application Priority Data

Nov. 8, 2019 (EP) ...................................... 19208188

(51) Int. Cl.
*H04B 17/00* (2015.01)

(52) U.S. Cl.
CPC .................................. *H04B 17/0085* (2013.01)

(58) Field of Classification Search
CPC ... H04L 1/20; H04L 1/24; H04L 25/03; G01S 13/36; G01S 13/524; H04B 1/7115
USPC ........................................................ 375/224
See application file for complete search history.

(56) References Cited

U.S. PATENT DOCUMENTS

| | | |
|---|---|---|
| 6,259,319 B1 | 7/2001 | Ghanadan et al. |
| 2010/0183095 A1 | 7/2010 | Lindenmeier et al. |
| 2016/0050569 A1* | 2/2016 | Olgaard ................. H04B 7/086 370/252 |
| 2016/0162261 A1 | 6/2016 | Kreusser |
| 2018/0372794 A1 | 12/2018 | Roth |
| 2019/0214724 A1 | 7/2019 | Schrattenecker et al. |
| 2020/0313269 A1* | 10/2020 | Lee ......................... H03F 3/245 |
| 2021/0072369 A1* | 3/2021 | Heller ................... G01S 13/931 |

FOREIGN PATENT DOCUMENTS

EP 2149996 B1 2/2010

OTHER PUBLICATIONS

Rohde & Schwarz GmbH & Co. KG, "Phase Adjustment of Two MIMO Signal Sources with Option B90 (Phase Coherence)", Application Note, Jan. 2009, 33 pages.

(Continued)

*Primary Examiner* — Khai Tran
(74) *Attorney, Agent, or Firm* — Christensen O'Connor Johnson Kindness PLLC

(57) ABSTRACT

A method for determining and/or adjusting phases of at least two electrical signals is disclosed. The method includes the following steps: a first frequency and/or a first power level for a first signal is set and a second frequency and/or a second power level for a second signal is set. The first signal and the second signal are superposed, thereby obtaining a superposed signal. A power parameter of the superposed signal is determined via a power measurement unit for several different phase offsets of the first signal and/or of the second signal. A relative phase between the first signal and the second signal is determined and/or set based on the determined power parameters. Moreover, a signal generator system is disclosed.

13 Claims, 2 Drawing Sheets

(56) References Cited

OTHER PUBLICATIONS

Rohde & Schwarz GmbH & Co. KG, "Characterizing Active Phased Array Antennas," Application Note, Aug. 2016, 50 pages.
Jung, Y., et al., "Least-Squares Phase Predistortion of a +30 dBm Class-D Outphasing RF PA in 65 nm CMOS," IEEE Transactions on Circuits and Systems I: Regular Papers 60(7):1915-1928, Jul. 2013.
Eid E.E., et al., "Adaptive Nulling Loop Control for 1.7-GHz Feedforward Linearization Systems," IEEE Transactions on Microwave Theory and Techniques 45(1):83-86, Jan. 1997.

* cited by examiner

METHOD AND SYSTEM FOR DETERMINING AND/OR ADJUSTING PHASES OF AT LEAST TWO ELECTRICAL SIGNALS

FIELD OF THE DISCLOSURE

The present disclosure relates to a method for determining and/or adjusting phases of at least two electrical signals. The present disclosure further relates to a signal generator system for determining and/or adjusting phases of at least two electrical signals.

BACKGROUND

Certain devices under test, for example chipsets for serializer-deserializer interfaces, need to be tested with two separate signals having certain predefined properties, such as a certain frequency, a certain amplitude and/or a certain phase difference between the two signals.

Usually, the two signals are generated via two arbitrary waveform generators (AWGs) that allows to set the amplitude, frequency and phase of the respective individual signal.

However, due to imperfections in the measurement setup, e.g. varying cable lengths due to thermal effects, the electrical path length for the two signals from the respective AWG to the device under test may vary such that it may be very difficult to exactly set a desired phase difference between the two signals at the device under test.

Accordingly, the object of the present disclosure is to provide a method for determining and/or adjusting phases of at least two electrical signals as well as a signal generator system that allow to reliably generate signals having a predetermined phase difference and/or to determine a phase difference between two electrical signals.

SUMMARY

Accordingly, this object or others is achieved by a method for determining and/or adjusting phases of at least two electrical signals. In an embodiment, the method comprises the following steps: A first frequency and/or a first power level for a first signal is set. A second frequency and/or a second power level for a second signal is set. The first signal and the second signal are superposed, thereby obtaining a superposed signal. A power parameter of the superposed signal is determined via a power measurement unit for several different phase offsets of the first signal and/or of the second signal, for example for each one of the several different phase offsets. A relative phase between the first signal and the second signal is determined and/or set based on the determined power parameters.

The present disclosure is based on the finding that the actual relative phase of the first signal and the second signal can be determined by measuring the power parameter of the superposed signal.

By implication, the relative phase of the first and the second signal can be adjusted by varying the relative phase until the power parameter reaches a value that is associated with the desired relative phase of the first signal and the second signal.

Measuring the power parameter is rather simple and possible with high precision. Thus, a simple and reliable method for generating signals having a predetermined phase difference and/or for determining a phase difference between two electrical signals is provided.

In some embodiments, the at least one power parameter comprises a power level of the superposed signal.

The at least one power parameter may further comprise a mean power of the superposed signal, a maximum power of the superposed signal, and/or a peak-to-average ratio of the superposed signal.

According to one aspect of the present disclosure, the determined power parameters are fitted to a mathematical model of the superposed signal. The mathematical model provides an interpolation between measurement points and/or an extrapolation of the power parameter beyond the measurement points, for example as a function of the relative phase between the first signal and the second signal. Accordingly, the mathematical model allows to determine the relative phase and/or to set the relative phase of the first signal and the second signal even for values that have not been measured directly.

According to another aspect of the present disclosure, the relative phase between the first signal and the second signal is set by adjusting the phase offset of the first signal and/or the phase offset of the second signal. Thus, the relative phase is adjusted in a simple manner by varying one or both of the phases of the first signal and the second signal.

For example, a phase offset of one of the first signal and the second signal is varied while the phase offset of the other one of the first signal and the second signal is kept constant. Alternatively, the phase offsets of both the first signal and the second signal may be varied such that the relative phase between the first signal and the second signal is varied in total.

In an embodiment of the present disclosure, a minimum of the power level of the superposed signal is determined and/or set. The minimum of the power level corresponds to differential signals, i.e. to a phase difference of $\pi$ between the first signal and the second signal, as the two signals then have exactly opposite phases and interfere destructively when combining them, i.e. superposing them.

According to another embodiment of the present disclosure, calibration parameters are determined based on the determined power parameters. The determined calibration parameters can then be used to generate the first signal and the second signal with the desired phase difference.

In some embodiments, an individual power level of the first signal and/or of the second signal is determined. The individual power level of the first signal and/or of the second signal may be a parameter of the mathematical model of the superposed signal. Thus, by determining the individual power level of the first signal and/or of the second signal, a parameter of the mathematical model is determined. In some embodiments, the individual power level of the first signal and/or of the second signal is measured via the power measurement unit by forwarding only one of the first signal and the second signal to the power measurement unit, i.e. by not superposing the first signal and the second signal.

A zero power level of the power measurement unit may be determined. The zero power level may be a parameter of the mathematical model of the superposed signal. Thus, by determining the zero power level, a parameter of the mathematical model is determined. In some embodiments, the zero power level is measured via the power measurement unit by forwarding none of the first signal and the second signal to the power measurement unit.

In another embodiment of the present disclosure, the first signal and the second signal are radio frequency signals.

According to another aspect of the present disclosure, the first frequency and the second frequency are equal to each other. Thus, there is a fixed, constant phase relation between the first signal and the second signal.

According to the present disclosure, the object or others is further achieved by a signal generator system for determining and/or adjusting phases of at least two electrical signals. In an embodiment, the signal generator system comprises a first signal generator configured to generate a first signal having a first frequency and/or a first power level. The signal generator system further comprises a second signal generator configured to generate a second signal having a second frequency and/or a second power level. The signal generator system further comprises a first splitter connected to the first signal generator, wherein the first splitter has at least two output channels. The signal generator system further comprises a second splitter connected to the second signal generator, wherein the second splitter has at least two output channels. The signal generator system further comprises a combiner being connected to a first output channel of the first splitter and to a first output channel of the second splitter, wherein the combiner is configured to superpose signals received from the first splitter and the second splitter, thereby generating a superposed signal. The combiner is connected to a power measurement circuit or unit that is configured to determine a power parameter of the superposed signal. The second output channels of the first splitter and of the second splitter are configured to be connected to a device under test or a phase measurement block.

Therein, the second output channels correspond to the channels that are not connected to the combiner. The second output channels may be connected with a second phase measurement block comprising a second combiner and a second power measurement unit or to a device under test.

Accordingly, a phase measurement block generally comprises a combiner and a power measurement unit.

Put differently, both of the output channels of the respective splitters may be connected with respective phase measurement blocks, namely a first one and a second one.

Generally, the first phase measurement block is assigned to the respective first output channels of the first and second splitters.

The optional second phase measurement block is connected with the respective second output channels of the first and second splitters.

Regarding the further advantages and properties of the signal generator system, reference is made to the explanations given above with respect to the method for determining and/or adjusting phases of at least two electrical signals, which also hold for the signal generator system and vice versa.

According to one aspect of the present disclosure, the signal generator system further comprises a control module composed of one or more control circuits. In an embodiment, the control module is configured to cause the signal generator system to perform the method described above. Regarding the further advantages and properties of the signal generator system, reference is made to the explanations given above with respect to the method for determining and/or adjusting phases of at least two electrical signals, which also hold for the signal generator system and vice versa.

According to another aspect of the present disclosure, the signal generator system further comprises a device under test, wherein the device under test is connected to the output channels of the first splitter and of the second splitter that are not connected to the combiner. Thus, by performing the steps described above, a desired phase difference between the first signal and the second signal can be set at the device under test for any desired frequency of the first signal and the second signal.

Moreover, the first signal and the second signal may be generated with a desired imbalance, i.e. the first signal and the second signal may have different power levels.

In some embodiments, differential signals may be generated with high precision and forwarded to the device under test. In other words, the first signal and the second signal may be generated such that their phase difference at the device under test is equal to $\pi$.

The signal generator system may comprise a second combiner and a second power measurement unit, wherein the second combiner is connected to the second output channel of the first splitter, wherein the second combiner is connected to the second output channel of the second splitter, wherein the second combiner is configured to superpose signals received from the first splitter and the second splitter, thereby generating a second superposed signal, and wherein the second power measurement unit is connected to an output channel of the second combiner, and wherein the second power measurement is configured to determine a power parameter of the second superposed signal. Based on a comparison of the power parameter of the second superposed signal with the power parameter of the first superposed signal, the above-mentioned calibration parameters can be determined. As mentioned above, the second combiner and the second power measurement unit may relate to the second phase measurement block.

In other words, the signal generator system is first calibrated with the second phase measurement block comprising the second combiner and the second power measurement unit. The second phase measurement block can then be replaced by the device under test and the obtained calibration parameters can be used to generate the first signal and the second signal with the desired phase difference at the device under test.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
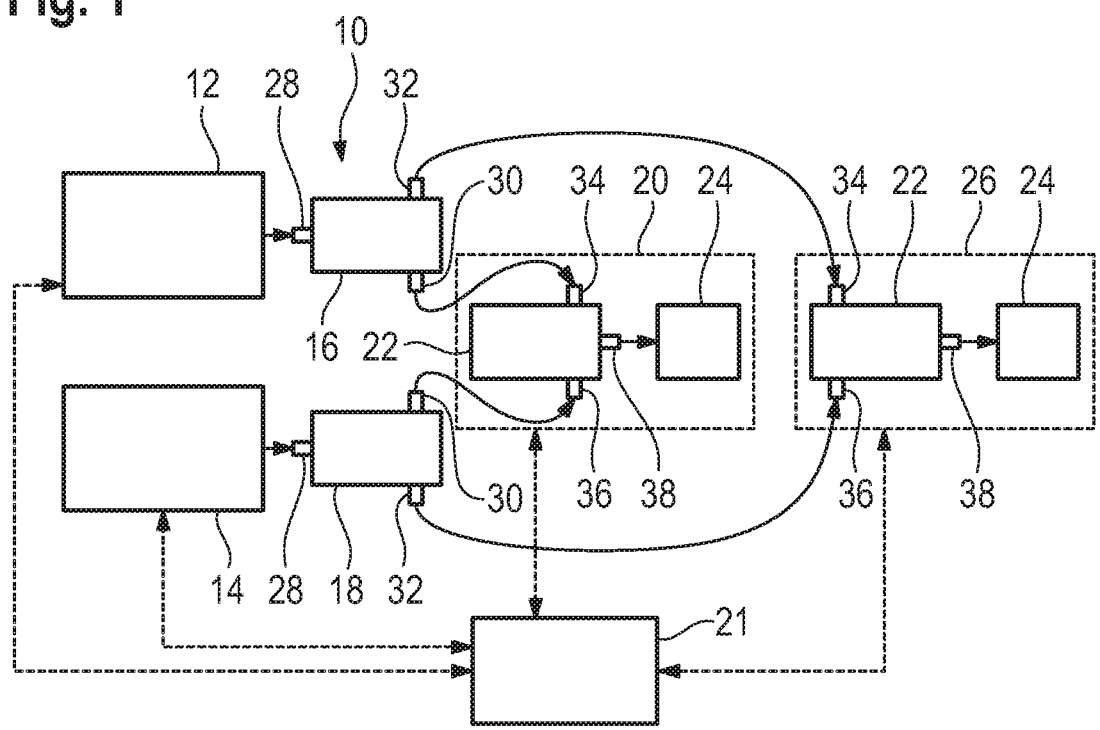
FIG. 1 schematically shows a signal generator system according to a first embodiment of the present disclosure.

FIG. 1 shows a block diagram of a signal generator system 10. The signal generator system comprises a first signal generator 12, a second signal generator 14, a first splitter unit 16, a second splitter unit 18, a first phase measurement block 20 and a control module 21. Each one of these components may comprise one or more circuits for carrying out its respective functionality, which will be described in more detail below. Alternatively, the functionality of two more of these components can be combined into one or more circuits.

In an embodiment, the first signal generator 12 and/or the second signal generator 14 each are established as an arbitrary waveform generator. In other words, signals with an arbitrary amplitude, frequency and phase can be generated via the first signal generator 12 and/or via the second signal generator 14. Alternatively, a single signal generator having at least two independent output channels may be provided. In this case, the first signal generator 12 and the second signal generator 14 are integrated into a single signal generator.

In the embodiment shown in FIG. 1, the first phase measurement block 20 comprises a combiner unit 22 and a power measurement unit 24.

The signal generator system 10 further comprises a second phase measurement block 26, as shown in FIG. 1. The second phase measurement block 26 comprises another combiner unit 22 and another power measurement unit 24. The second phase measurement block 26 is built up similar to the first phase measurement block 20, for example identical to the first phase measurement block 20. As such, the second phase measurement block 26 may comprise one or more circuits for carrying out its respective functionality, which will be described in more detail below.

The first splitter unit 16 and the second splitter unit 18 each comprise an input channel 28, a first output channel 30 and a second output channel 32. The combiner units 22 each comprise a first input channel 34, a second input channel 36, and an output channel 38.

In the embodiment of FIG. 1, the input channel 28 of the first splitter unit 16 is connected to the first signal generator 12. The input channel 28 of the second splitter unit 18 is connected to the second signal generator 14. The first output channel 30 of the first splitter unit 16 is connected to the first input channel 34 of the combiner unit 22 of the first phase measurement block 20. The first output channel 30 of the second splitter unit 18 is connected to the second input channel 36 of the combiner unit 22 of the first phase measurement block 20. The second output channel 32 of the first splitter unit 16 is connected to the first input channel 34 of the combiner unit 22 of the second phase measurement block 26. The second output channel 32 of the second splitter unit 18 is connected to the second input channel 36 of the combiner unit 22 of the second phase measurement block 26.

The power measurement unit 24 of the first phase measurement block 20 is connected to the output channel 38 of the combiner unit 22 of the first phase measurement block 20. The power measurement unit 24 of the second phase measurement block 26 is connected to the output channel 38 of the combiner unit 22 of the second phase measurement block 26. The control module 21 is connected to the first signal generator 12, to the second signal generator 14, to the first phase measurement block 20 and to the second phase measurement block 26 in a signal transmitting manner, respectively.

Figure 2:
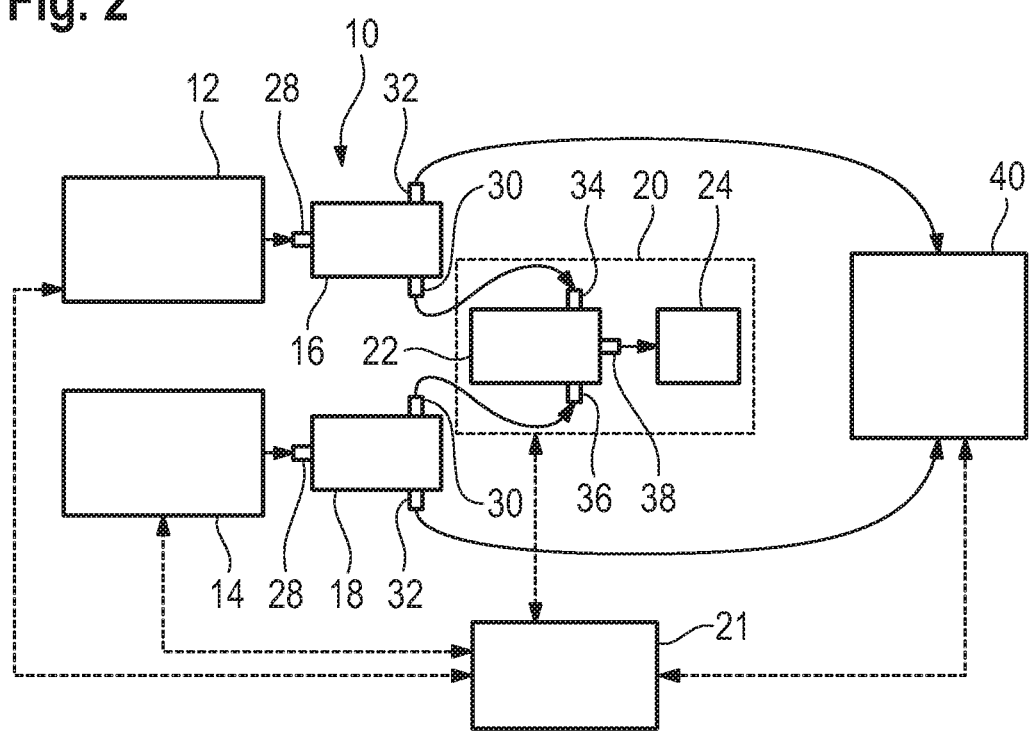
FIG. 2 schematically shows a signal generator system according to a second embodiment of the present disclosure.

Signal transmitting connections are generally represented with arrows in FIGS. 1 and 2, wherein the arrows also indicate the usual signal propagation direction in the signal generator system 10. Therein, the individual components may be connected via suitable electrical cables, electrical connectors, etc.

FIG. 2 shows a second embodiment of the signal generator system 10. Therein and in the following, elements with equal or similar functionality are numerated with the same reference numerals as in FIG. 1.

The embodiment of FIG. 2 differs from the embodiment of FIG. 1 in that instead of the second phase measurement module 26, a device under test 40 is provided. In this embodiment, the device under test 40 is connected to the second output channel 32 of the first splitter unit 16 and to the second output channel 32 of the second splitter unit 18, respectively. The control module 21 may be connected to the device under test 40 in a signal transmitting manner.

Generally speaking, the signal generator system 10 is configured to generate at least two electrical signals as well as to determine and/or adjust phases of the individual electrical signals and/or a relative phase of the at least two electrical signals.

In an embodiment, the signal generator system 10 is configured to perform the method described in the following with reference to the flow chart of FIG. 3. More specifically, the control module 21 (e.g., one or more control circuits) is configured to cause the signal generator system 10 to perform the method described in the following.

A first frequency, a first power level and/or a first phase for a first signal are set at the first signal generator 12 and the corresponding first signal is generated (step S1). In other words, the relevant parameters for generating the first signal are set at the first signal generator 12 and the first signal is generated. The first signal is forwarded to the first splitter unit 16, which in turn forwards the first signal to the combiner units 22 of the first phase measurement block 20 and of the second phase measurement block 26.

Similarly, a second frequency, a second power level and/or a second phase for a second signal is set at the second signal generator 14 and the corresponding second signal is generated (step S2). Therein, the first frequency and the second frequency are equal to each other, such that there is a constant phase relation between the first signal and the second signal. In some embodiments, the first signal and the second signal are radio frequency signals.

The second signal is forwarded to the second splitter unit 18, which in turn forwards the first signal to the combiner units 22 of the first phase measurement block 20 and of the second phase measurement block 26.

The combiner unit 22 of the first phase measurement block 20 superposes the first signal and the second signal such that a superposed signal is obtained (step S3). The superposed signal is forwarded to the power measurement unit 24 of the first phase measurement block 20.

The power measurement unit 24 then determines at least one power parameter of the superposed signal (step S4).

In an embodiment, the at least one power parameter comprises a power level of the superposed signal. The at least one power parameter may further comprise a mean power of the superposed signal, a maximum power of the superposed signal, and/or a peak-to-average ratio of the superposed signal.

Figure 3:
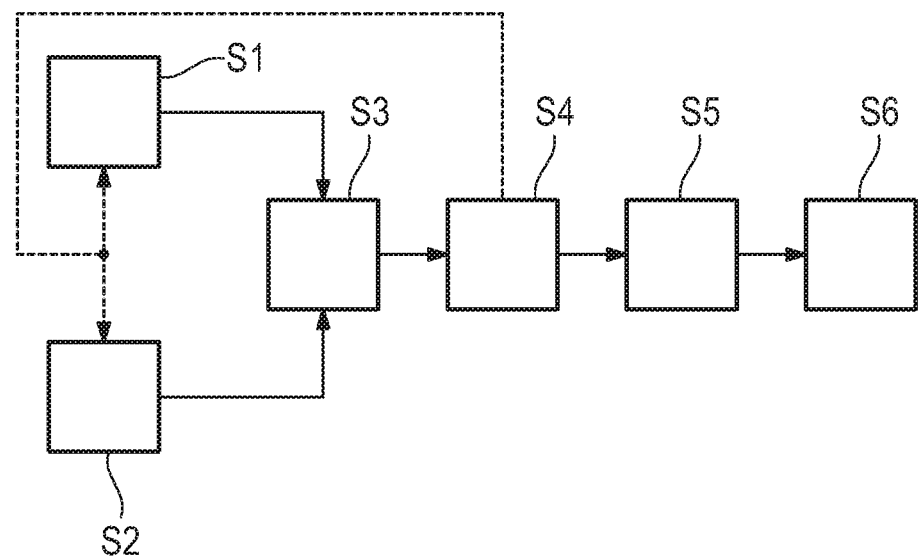
FIG. 3 shows a flow chart of a representative method for determining and/or adjusting phases of at least two electrical signals according to an embodiment of the present disclosure.

Steps S1 to S4 are repeated several times for different relative phases between the first signal and the second signal, as is indicated by the dashed arrow in FIG. 3.

For example, a phase offset of one of the first signal and the second signal is varied while the phase offset of the other one of the first signal and the second signal is kept constant. Alternatively, the phase offsets of both the first signal and the second signal may be varied such that the relative phase between the first signal and the second signal is varied in total.

The obtained power parameters are then fitted to a mathematical model of the superposed signal (step S5), for example to a mathematical model of the power level of the superposed signal.

Figure 4:
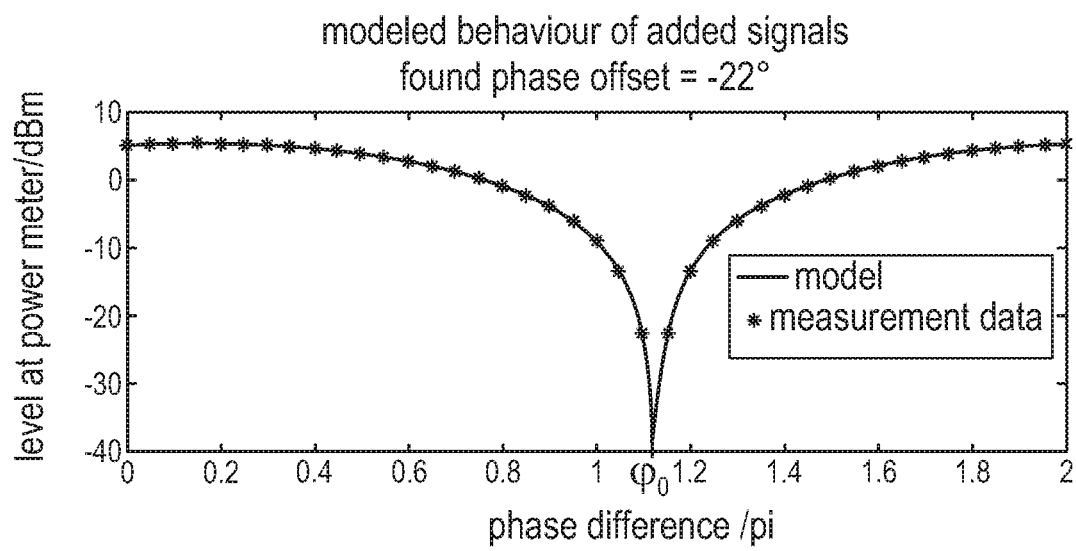
FIG. 4 shows a diagram of power level plotted against phase difference.

Step S5 is illustrated in FIG. 4, which shows a diagram of the superposed signal power level plotted against the phase difference between the first signal and the second signal. It is noted that the "phase difference/$\pi$" axis in FIG. 4 is the phase difference set at the first signal generator 12 and the second signal generator 14.

FIG. 4 shows some exemplary measurement data points for measurements of the power level at several different relative phases between the first signal and the second signal.

The drawn through line shows the underlying mathematical model of the power level of the superposed signal. In this mathematical model, the power level $P_M$ of the superposed signal is given by the following relation:

$$P_M(\varphi) = P_Z + |\sqrt{P_1} + \sqrt{P_2} e^{i\varphi}|^2,$$

wherein $P_Z$ is a zero value of the power level of the power measurement unit 24, $P_1$ is the power level of the first signal, $P_2$ is the power level of the second signal, and $\varphi$ is the relative phase between the first and the second signal at the combiner unit 22.

If the zero value of the power level of the power measurement unit 24, the power level of the first signal and/or the power level of the second signal are not already known, they may be determined by performing suitable measurements with the power measurement unit 24.

For example, in order to determine the power level of the first signal, only the first signal is forwarded to the power measurement unit 24. Similarly, in order to determine the power level of the second signal, only the second signal is forwarded to the power measurement unit 24.

Finally, in order to determine the zero value of the power level of the power measurement unit 24, none of the first signal and the second signal is forwarded to the power measurement unit 24.

Based on the fit of the measured power levels to the mathematical model, a minimum of the power level of the superposed signal and an associated phase offset parameter $\varphi_0$ is determined. The phase offset parameter $\varphi_0$ corresponds to the relative phase between the first signal and the second signal at which there is destructive interference between the first signal and the second signal.

In other words, the phase offset parameter corresponds to the relative phase between the first signal and the second signal that has to be set at the first signal generator 12 and the second signal generator 14 such that the actual phase difference between the first signal and the second signal at the combiner unit 22 is equal to $\pi$ or, put differently, to 180°.

For an idealized measurement setup, i.e. when there are no imperfections in connections between the individual components and when all connections have equal length, the offset parameter $\varphi_0$ would be equal to $\pi$ or, put differently, to 180°.

However, as the connections may have different lengths and/or different impedances, the relative phase offset that has to be set at the first signal generator 12 and the second signal generator 14 generally differs from $\pi$.

Moreover, based on the fit of the measured power levels to the mathematical model shown in FIG. 4, the relative phase between the first signal and the second signal can be set to a desired value by setting the relative phase such that a certain power level of the superposed signal is reached.

Additionally, steps S1 to S6 may also be performed with the second phase measurement block 26, such that a minimum of the power level of a superposed signal at the second phase measurement block 26 and an associated phase offset parameter $\varphi'_0$ are determined.

Once again, for an idealized measurement setup, $\varphi'_0$ would be equal to $\varphi_0$. However, due to different connections lengths and/or other imperfections in the signal generator system 10, the relative phase between the first signal and the second signal at the second phase measurement block 26 generally differs from both the relative phase at the first measurement block 20 and from the relative phase at the signal generators 12, 14.

By comparing the results for $\varphi_0$ and $\varphi'_0$, at least one calibration parameter $\Delta_\varphi$ are obtained such that a relation $\varphi'_0 = f(\varphi_0) = \varphi_0 + \Delta_\varphi$ between $\varphi'_0$ and $\varphi_0$ is determined.

Thus, the relative phase of the first signal and the second signal at the second phase measurement block 26 can then be determined based on the relative phase at the first phase measurement block 20 and based on the at least one calibration parameter $\Delta_\varphi$.

It is noted that the phase difference may depend on the frequency of first signal and the second signal. Thus, the steps described above may be repeated for several frequencies, such that calibration parameters for several different frequencies are obtained.

Thus, by performing the steps described above, a desired phase difference between the first signal and the second signal can be set at the device under test 40 of FIG. 2 for any desired frequency of the first signal and the second signal.

In other words, the signal generator system 10 is first calibrated with the second phase measurement block 26. The second phase measurement block 26 can then be replaced by the device under test 40 and the obtained calibration parameters can be used to generate the first signal and the second signal with the desired phase difference at the device under test 40.

In some embodiments, differential signals may be generated with high precision and forwarded to the device under test 40. In other words, the first signal and the second signal may be generated such that their phase difference at the device under test 40 is equal to $\pi$.

Moreover, the first signal and the second signal may be generated with a desired imbalance, i.e. the first signal and the second signal may have different power levels.

The signal generator system 10 is configured to perform one or more steps schematically shown, for example, in FIG. 3. In some embodiments, the control module 21 (e.g., one or more control circuits) is configured to cause the signal generator system 10 to perform one or more steps schematically shown, for example, in FIG. 3.

In some embodiments, one or more of the components of the signal generator system 10 (e.g., the control module 21, etc.) includes one or more computer-readable media containing computer readable instructions embodied thereon that, when executed by one or more computing device, computer circuits, etc., (contained in or associated with the signal generator system 10 or components thereof), cause the one or more computing devices, computer circuits, etc., to perform one or more steps of the method of FIG. 3 described above. In some embodiments, the one or more computing devices, computer circuits, etc., includes a microprocessor, a microcontroller, a central processing unit, a graphics processing unit (GPU), a digital signal processor (DSP), etc.

In some embodiments, the one or more computer-readable media contains computer readable instructions embodied thereon that, when executed by the one or more computer circuits, cause the one or more computer circuits to perform one or more steps of any of the methods of Claims 1-9.

As described briefly above, certain embodiments disclosed herein utilize circuitry (e.g., one or more circuits) in order to implement standards, protocols, methodologies or technologies disclosed herein, operably couple two or more components, generate information, process information, analyze information, store information, display information, generate signals, encode/decode signals, convert signals, transmit and/or receive signals, control other devices, etc. Circuitry of any type can be used. It will be appreciated that the term "information" can be use synonymously with the term "signals" in this paragraph.

In an embodiment, circuitry includes, among other things, one or more computing devices or computer circuits such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

Of course, in some embodiments, two or more of the modules, units, components, etc., described above, or parts thereof, can be integrated or share hardware and/or software circuitry, etc. In some embodiments, these components, or parts thereof, may be grouped in a single location or distributed over a wide area. In circumstances were the components are distributed, the components are accessible to each other via communication links.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for determining or adjusting phases of at least two electrical signals, comprising:
   setting a first frequency or a first power level for a first signal at a first signal generator;
   setting a second frequency or a second power level for a second signal at a second signal generator;
   forwarding the first signal to a first splitter having at least two output channels;
   forwarding the second signal to a second splitter having at least two output channels;
   superposing the first signal and the second signal, thereby obtaining a superposed signal by a combiner;
   determining a power parameter of the superposed signal via a power measurement circuit for several different phase offsets of the first signal or of the second signal; and
   determining or setting a relative phase between the first signal and the second signal based on the determined power parameters,
   wherein the combiner is connected to a first output channel of the first splitter and to a first output channel of the second splitter,
   wherein the combiner is connected to the power measurement circuit, and
   wherein the second output channels of the first splitter and of the second splitter are configured to be connected to a device under test or a phase measurement block.

2. The method according to claim 1, wherein the determined power parameters are fitted to a mathematical model of the superposed signal.

3. The method according to claim 1, wherein the relative phase between the first signal and the second signal is set by adjusting the phase offset of the first signal or the phase offset of the second signal.

4. The method according to claim 1, wherein a minimum of a power level of the superposed signal is determined or set.

5. The method according to claim 1, wherein calibration parameters are determined based on the determined power parameters.

6. The method according to claim 1, wherein an individual power level of the first signal or of the second signal is determined.

7. The method according to claim 1, wherein a zero power level of the power measurement circuit is determined.

8. The method according to claim 1, wherein the first signal and the second signal are radio frequency signals.

9. The method according to claim 1, wherein the first frequency and the second frequency are equal to each other.

10. A signal generator system for determining or adjusting phases of at least two electrical signals, comprising:
    a first signal generator being configured to generate a first signal having a first frequency or a first power level,
    a second signal generator being configured to generate a second signal having a second frequency or a second power level,
    a first splitter being connected to the first signal generator, wherein the first splitter has at least two output channels, a second splitter being connected to the second signal generator, wherein the second splitter has at least two output channels, and a combiner being connected to a first output channel of the first splitter and to a first output channel of the second splitter, wherein the combiner is configured to superpose signals received from the first splitter and the second splitter, thereby generating a superposed signal, wherein the combiner is connected to a power measurement circuit that is configured to determine a power parameter of the superposed signal, wherein the second output channels of the first splitter and of the second splitter are configured to be connected to a device under test or a phase measurement block.

11. The signal generator system of claim 10, further comprising a control circuit, wherein the control circuit is configured to cause the signal generator system to:

set a first frequency or a first power level for a first signal;

set a second frequency or a second power level for a second signal;

superpose the first signal and the second signal, thereby obtaining a superposed signal;

determine a power parameter of the superposed signal via a power measurement circuit for several different phase offsets of the first signal or of the second signal; and determine or setting a relative phase between the first signal and the second signal based on the determined power parameters.

12. The signal generator system according to claim 10, further comprising a device under test, wherein the device under test is connected to the output channels of the first splitter and of the second splitter that are not connected to the combiner.

13. The signal generator system according to claim 10, further comprising a second combiner and a second power measurement circuit, wherein the second combiner is connected to the second output channel of the first splitter, wherein the second combiner is connected to the second output channel of the second splitter, wherein the second combiner is configured to superpose signals received from the first splitter and the second splitter, thereby generating a second superposed signal, and wherein the second power measurement circuit is connected to an output channel of the second combiner, and wherein the second power measurement circuit is configured to determine a power parameter of the second superposed signal.

* * * * *